US010438829B2

(12) United States Patent
Murata et al.

(10) Patent No.: US 10,438,829 B2
(45) Date of Patent: Oct. 8, 2019

(54) PURGE DEVICE AND PURGE METHOD

(71) Applicant: MURATA MACHINERY, LTD., Kyoto-shi, Kyoto (JP)

(72) Inventors: Masanao Murata, Ise (JP); Takashi Yamaji, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 132 days.

(21) Appl. No.: 15/116,527

(22) PCT Filed: Dec. 17, 2014

(86) PCT No.: PCT/JP2014/083436
§ 371 (c)(1),
(2) Date: Aug. 4, 2016

(87) PCT Pub. No.: WO2015/118782
PCT Pub. Date: Aug. 13, 2015

(65) Prior Publication Data
US 2016/0351427 A1 Dec. 1, 2016

(30) Foreign Application Priority Data

Feb. 7, 2014 (JP) .................................. 2014-022508

(51) Int. Cl.
*H01L 21/67* (2006.01)
*B08B 5/04* (2006.01)
(Continued)

(52) U.S. Cl.
CPC .......... *H01L 21/67393* (2013.01); *B08B 5/04* (2013.01); *B08B 9/08* (2013.01);
(Continued)

(58) Field of Classification Search
None
See application file for complete search history.

(56) References Cited

U.S. PATENT DOCUMENTS

| 6,042,651 A | 3/2000 | Roberson, Jr. et al. |
| 2008/0156069 A1 | 7/2008 | Murata et al. |
| 2013/0180451 A1* | 7/2013 | Horiuchi ........... H01L 21/67017 118/715 |

FOREIGN PATENT DOCUMENTS

| JP | 2000-340641 A | 12/2000 |
| JP | 2010-147451 A | 7/2010 |

(Continued)

OTHER PUBLICATIONS

Official Communication issued in International Patent Application No. PCT/JP2014/083436, dated Mar. 17, 2015.

(Continued)

*Primary Examiner* — Mikhail Kornakov
*Assistant Examiner* — Pradhuman Parihar
(74) *Attorney, Agent, or Firm* — Keating & Bennett, LLP

(57) ABSTRACT

A purge apparatus is a purge apparatus that purges an inside of a storage container in which a product is stored, with a purge gas. The purge apparatus includes a discharge pipe that connects to a discharge port of the storage container to discharge the purge gas inside the storage container, a meter that measures an exhaust flow rate that is a flow rate of the purge gas flowing through the discharge pipe when the purging is carried out, and a detector that determines whether the purging is satisfactory, based on the exhaust flow rate measured by the meter.

13 Claims, 7 Drawing Sheets

(51) Int. Cl.
*B08B 9/08* (2006.01)
*H01L 21/673* (2006.01)
*H01L 21/677* (2006.01)

(52) U.S. Cl.
CPC .. *H01L 21/67253* (2013.01); *H01L 21/67769* (2013.01); *H01L 21/67363* (2013.01)

(56) References Cited

FOREIGN PATENT DOCUMENTS

| | | | | |
|---|---|---|---|---|
| JP | 2010-182747 A | 8/2010 | | |
| JP | 4670808 B2 | 4/2011 | | |
| JP | WO 2012043053 A1 * | 4/2012 | ....... | H01L 21/67017 |

OTHER PUBLICATIONS

English translation of Official Communication issued in corresponding International Application PCT/JP2014/083436, dated Aug. 18, 2016.

* cited by examiner

PURGE DEVICE AND PURGE METHOD

BACKGROUND OF THE INVENTION

1. Field of the Invention

The present invention relates to a purge apparatus and a purge method of purging an inside of a storage container in which a product is stored, with a purge gas, such as an inert gas or purified dry air.

2. Description of the Related Art

For example, a purge apparatus is known which keeps cleanliness by introducing a purge gas (purging) to the inside of a storage container in which a product, such as a semiconductor wafer or a glass substrate, is stored. In such a purge apparatus, the flow rate of the purge gas supplied to the storage container may be controlled. However, a failure of a control circuit in the purge apparatus or a problem occurred in a supply channel of purge gas may prevent purge gas from being actually supplied into the storage container at a desired flow rate and may result in unsatisfactory purging. There is therefore a demand for determining whether purge gas is suppled into a storage container at a desired flow rate (whether satisfactory purging is being performed).

Japanese Patent No. 4670808 discloses a technique for measuring the flow rate of purge gas supplied to the inside of a storage container. With the measurement container described in Japanese Patent No. 4670808, a dedicated flow rate-measuring unit is placed on the purge apparatus to measure the flow rate of the purge gas supplied from the purge apparatus, so that whether satisfactory purging is performed can be determined. However, it is sometimes desired that whether satisfactory purging is being performed should be determined during a process of actually supplying purge gas to a storage container to be purged.

SUMMARY OF THE INVENTION

Preferred embodiments of the present invention provide a purge apparatus and a purge method capable of determining whether a satisfactory purge is being performed during a process of actually supplying purge gas to a storage container to be purged.

A purge apparatus according to an aspect of various preferred embodiments of the present invention purges an inside of a storage container in which a product is stored, with a purge gas. The purge apparatus includes a discharge pipe that connects to a discharge port of the storage container to discharge the purge gas inside the storage container, a meter that measures an exhaust flow rate that is a flow rate of the purge gas flowing through the discharge pipe when the purging is carried out, and a detector that determines whether the purging is satisfactory, based on the exhaust flow rate measured by the meter.

In such a purge apparatus, the meter that measures the flow rate of purge gas flowing through the discharge pipe is provided not in a measuring unit placed on the purge apparatus but on a purge apparatus side. Thus, the exhaust flow rate is able to be measured when purge gas is supplied to the storage container in a state in which the storage container to be purged is actually placed on the purge apparatus, and whether purging is satisfactory is able to be determined based on the measured exhaust flow rate. Accordingly, whether satisfactory purging is being performed is able to be determined during a process of actually supplying purge gas to the storage container.

The inventors of the subject application have conducted elaborate studies that led to the discovery that the exhaust efficiency is greatly affected by the hermeticity of the storage container. That is, when the flow rate of purge gas supplied to the storage container is greater than a predetermined flow rate (when the internal pressure of the storage container is greater than a predetermined pressure), the purge gas leaks from a portion other than the discharge port of the storage container (for example, between the cover and the body of the storage container) and the flow rate of exhaust discharged from the discharge pipe tends to be saturated. In other words, it has been discovered that a exhaust flow rate that is proportional or substantially proportional to the supply flow rate is obtained up to the predetermined flow rate at which purge gas leaks from a portion other than the discharge port of the storage container.

In a preferred embodiment of the present invention, the purge apparatus may further include a flow rate controller configured or programmed to switch between a first mode in which the purging is carried out by supplying the purge gas to the storage container at a first flow rate and a second mode in which the purging is carried out by supplying the purge gas to the storage container at a second flow rate. In this case, the meter may measure the exhaust flow rate in the first mode, and the detector may determine whether the purging is satisfactory, based on the exhaust flow rate measured in the first mode. Here, the first flow rate is a flow rate up to a predetermined flow rate, in the storage container in which the purge gas leaks from a portion other than the discharge port of the storage container when the flow rate of the purge gas supplied to the storage container is greater than the predetermined flow rate. The second flow rate is a flow rate greater than the first flow rate.

With such a purge apparatus, whether purging is being performed satisfactorily is able to be determined based on the supply flow rate that is the first flow rate at which the exhaust flow rate is proportional to the supply flow rate, and the exhaust flow rate obtained when the purging is being performed at the first flow rate. Thus, whether purging is being performed satisfactorily is able to be determined based on the supply flow rate and the exhaust flow rate proportional to each other, thus enabling an accurate determination.

In a preferred embodiment of the present invention, the flow rate controller may start the purging in the second mode and thereafter switch to the first mode. The meter may measure the exhaust flow rate in the first mode. The detector may determine whether the purging is satisfactory, based on the exhaust flow rate measured in the first mode.

Such a purge apparatus is able to initially supply purge gas to the storage container at a relatively large flow rate to clean the inside of the storage container early. This reduces the possibility that the product is contaminated.

A purge method according to another aspect of various preferred embodiment of the present invention is a method of purging an inside of a storage container in which a product is stored, with a purge gas. The purge method includes connecting a discharge pipe to a discharge port of the storage container, the discharge pipe being capable of discharging the purge gas inside the storage container; measuring an exhaust flow rate that is a flow rate of the purge gas flowing through the discharge pipe when the purging is carried out; and determining whether the purging is satisfactory, based on the measured exhaust flow rate.

With this purge method, whether satisfactory purging is being performed is able to be determined during a process of actually supplying purge gas to the storage container.

In a preferred embodiment of the present invention, an exhaust flow rate that is a flow rate of the purge gas flowing through the discharge pipe when the purging is carried out by supplying the purge gas to the storage container at a first flow rate may be measured. Whether the purging is satisfactory may be determined based on the measured exhaust flow rate. Here, the first flow rate is a flow rate up to a predetermined flow rate, in the storage container in which the purge gas leaks from a portion other than the discharge port of the storage container when the flow rate of the purge gas supplied to the storage container is greater than the predetermined flow rate. A second flow rate is a flow rate greater than the first flow rate.

With this purge method, whether the purging is being performed satisfactorily is able to be determined based on the supply flow rate that is the first flow rate at which the exhaust flow rate is proportional to the supply flow rate, and the exhaust flow rate obtained when the purging is being performed at the first flow rate. Thus, whether the purging is being performed satisfactorily is able to be determined based on the supply flow rate and the exhaust flow rate proportional to each other, thus enabling an accurate determination.

According to various preferred embodiments of the present invention, whether satisfactory purging is being performed is able to be determined during a process of actually supplying purge gas to a storage container.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
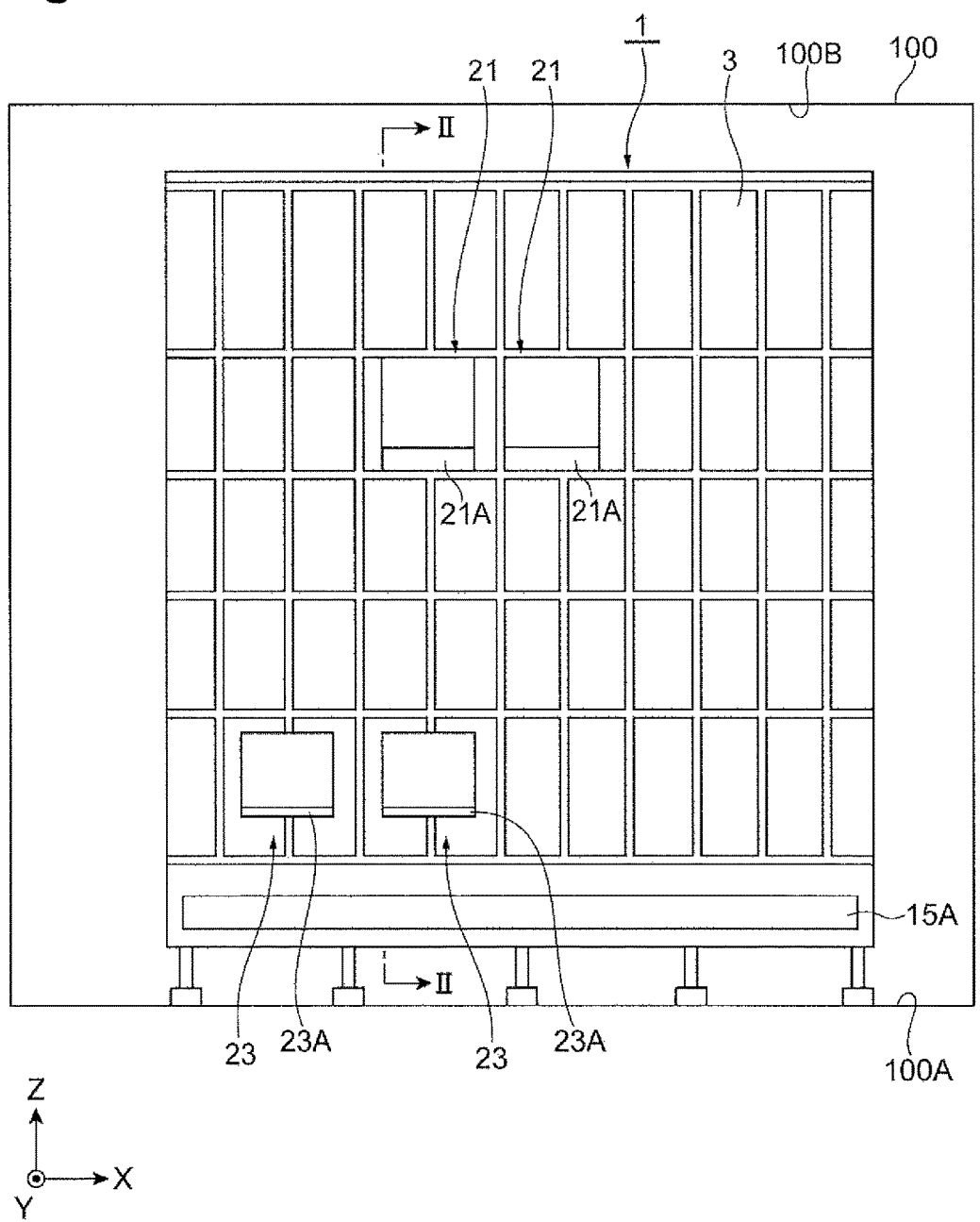
FIG. 1 is a front view showing a purge stocker including a purge apparatus according to a preferred embodiment of the present invention.

Preferred embodiments will be described below with reference to the drawings. In a description of the drawings, the same elements are denoted with the same reference signs, and an overlapping description will be omitted. The scale in the drawings is not always the same.

Figure 2:
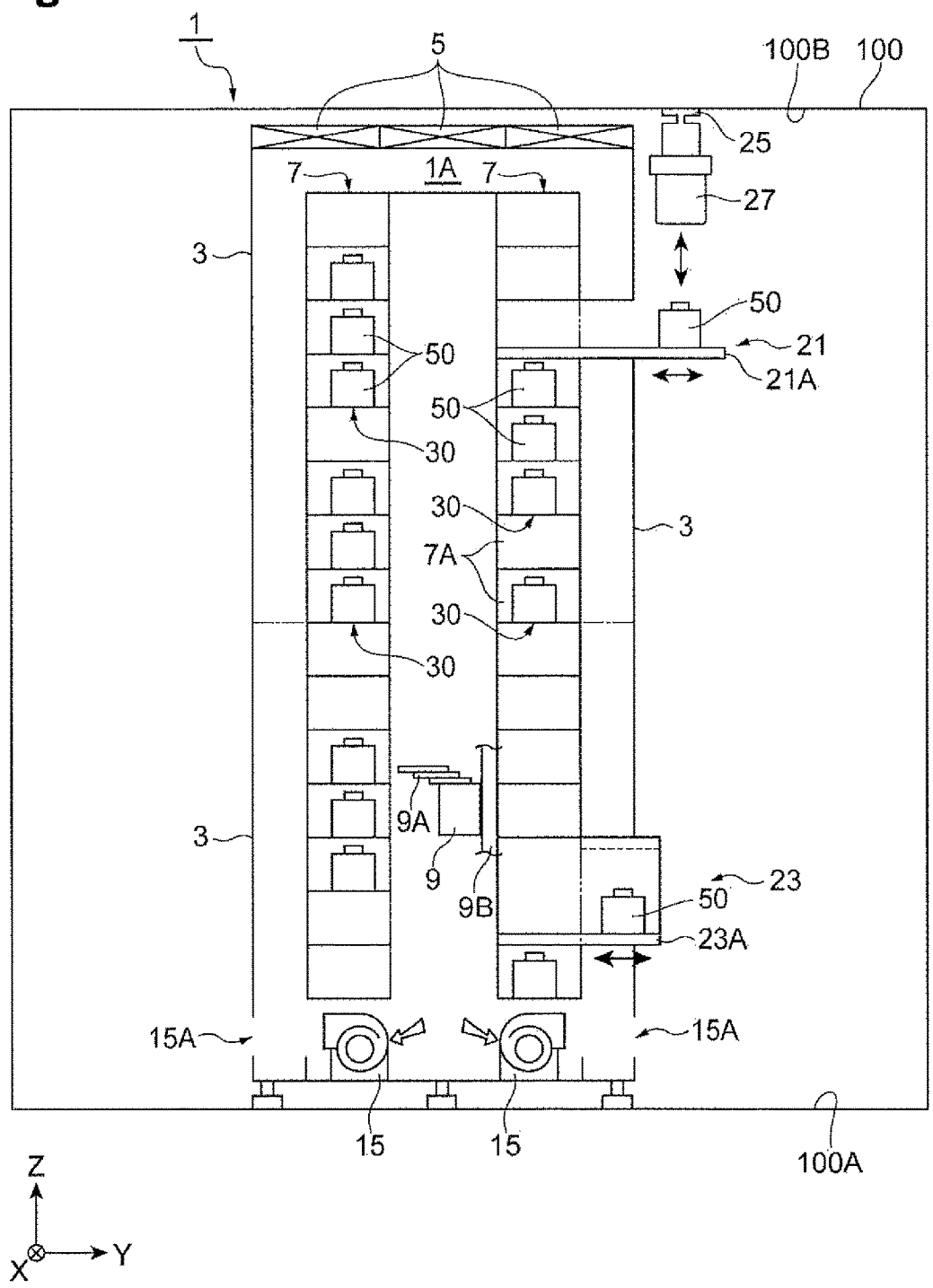
FIG. 2 is a cross-sectional view of the purge stocker in FIG. 1 as viewed from the line II-II.

A purge apparatus 30 according to a preferred embodiment of the present invention will be described. The purge apparatus 30 purges the inside of a storage container 50, such as a front opening unified pod (FOUP), in which a product, such as a semiconductor wafer or a glass substrate, is stored, with a purge gas. Examples of the purge gas as used herein include inert gases and purified dry air. The purge apparatus 30 is disposed, for example, in a purge stocker 1 that keeps a storage container 50 in which a product is stored. As shown in FIG. 1 and FIG. 2, the purge stocker 1 is provided in, for example, a clean room 100.

The purge stocker 1 provided in such a clean room 100 includes a partition 3, fan filter units (FFUs) 5, racks 7, a crane 9, an exhaust port 15A, an overhead hoist transfer (OHT) port 21, and a manual port 23.

The partition 3 is a portion that partitions (defines) a region above a floor 100A, and a storage area 1A is provided inside the partition 3. A plurality of FFUs 5 are provided along a predetermined direction on the ceiling of a space separated by the partition 3, that is, above the storage area 1A. The FFUs 5 suck the purified air from the outside of the storage area 1A to the inside of the storage area 1A to blow the purified air downward of the storage area 1A. The exhaust port 15A is a portion provided near the bottom of the storage area 1A to discharge gas including purge gas from the inside of the storage area 1A to the outside of the storage area 1A. The gas including purge gas is discharged from the storage area 1A by the exhaust fan 15.

The racks 7 keep storage containers 50 and are provided in multiple rows (here, two rows) in the inside of the storage area 1A. Each rack 7 extends in a predetermined direction X, and the two rows of racks 7, 7 are disposed to be opposed to each other in the depth direction Y. Each rack 7 includes a plurality of storage shelves 7A on which storage containers 50 are placed and kept, along the predetermined direction X and the vertical direction Z.

The crane 9 loads and unloads storage containers 50 into/from the storage shelves 7A and is disposed in a region sandwiched between the racks 7 and 7 opposed to each other. The crane 9 is able to run on a transport rail (not shown) disposed on the floor along the direction X in which the racks 7 extend, to move along the direction X in which the racks 7 extend. The crane 9 includes a stage 9A that is able to be lifted and lowered along a guide rail 9B so that storage containers 50 are loaded into and unloaded from a plurality of storage shelves 7A provided in the vertical direction.

A storage container 50 is loaded into and unloaded from the purge stocker 1 through the OHT port 21 and the manual port 23. The OHT port 21 delivers a storage container 50 between the purge stocker 1 and a ceiling vehicle (OHT) 27 running on a transport rail 25 laid on the ceiling 100B and includes a conveyor 21A that transfers a storage container 50. The manual port 23 delivers a storage container 50 between the operator and the purge stocker 1 and includes a conveyor 23A that transfers a storage container 50.

The storage shelf 7A of the rack 7 is provided with a purge apparatus 30 that purges the inside of the storage container 50 placed thereon with a purge gas (for example, nitrogen gas). The purge apparatus 30 is an apparatus that supplies and discharges a purge gas into the storage container 50 placed on the storage shelf 7A.

Figure 3A:
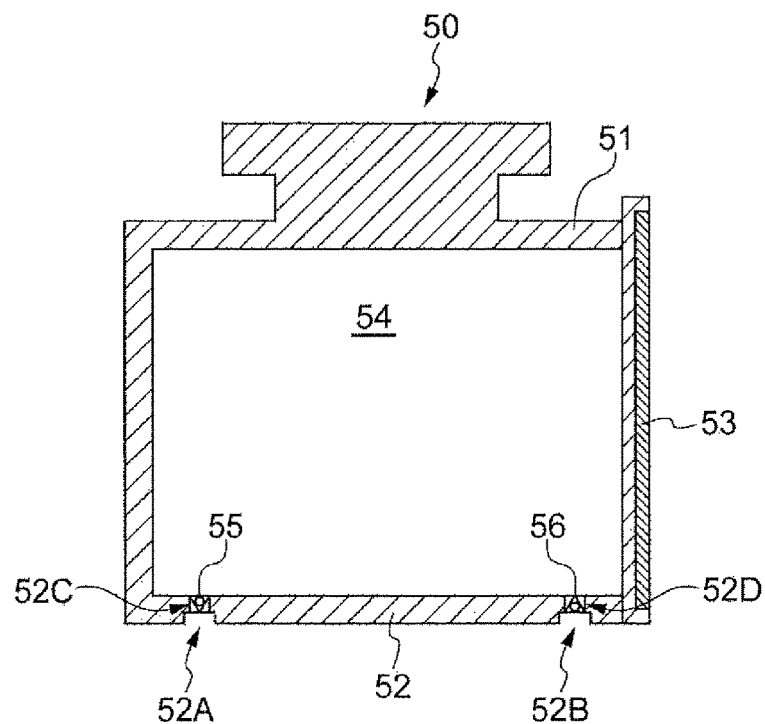
FIG. 3A is a cross sectional view showing a configuration of a storage container to be purged by the purge apparatus in FIG. 1.
Figure 3B:
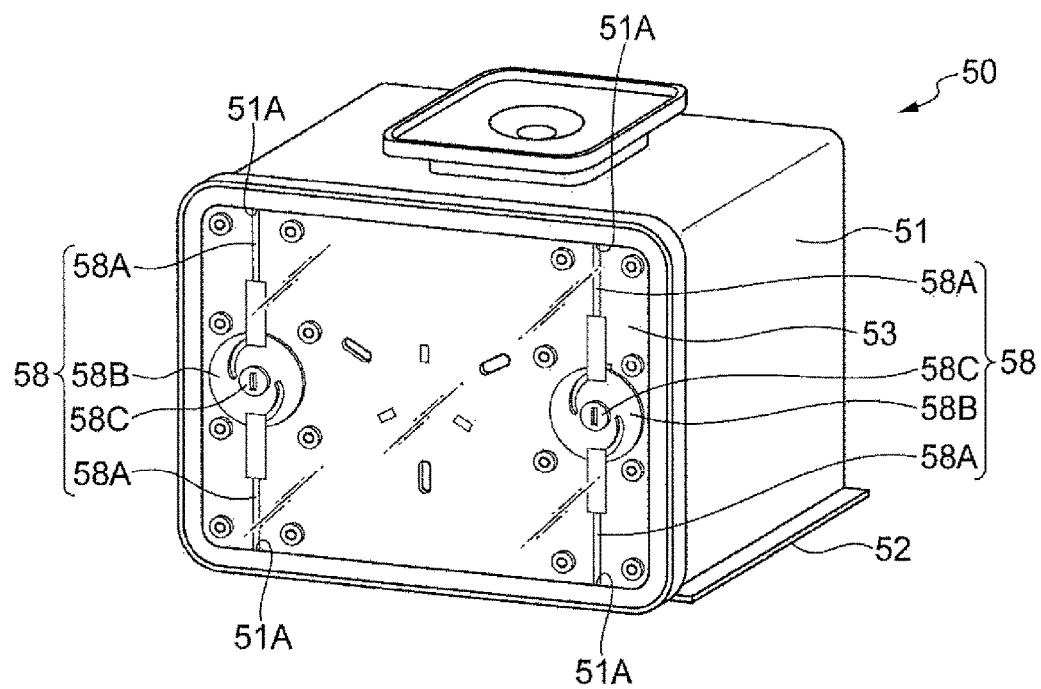
FIG. 3B is a perspective view showing a configuration of a storage container to be purged by the purge apparatus in FIG. 1.

The storage container 50 will now be described. As shown in FIG. 3A and FIG. 3B, the storage container 50 includes a body 51 and a cover 53 that define a casing. The storage container 50 includes a sealed space 54 defined by the body 51 and the cover 53. The sealed space 54 accommodates a plurality of semiconductor wafers (not shown).

The lower surface of the bottom 52 that is the bottom surface of the body 51 includes discharge ports 56 near the right and left ends of the front end, and supply ports 55 at the right and left ends of the rear end, where the side on which the cover 53 is disposed is the front. The supply ports 55 each include a connection portion 52A and a communication portion 52C. The discharge ports 56 each include a connection portion 52B and a communication portion 52D. In this example, the connection portion 52A is connectable to the supply pipe 31 of the purge apparatus 30 described in detail later. The connection portion 52B is connectable to the discharge pipe 33 of the purge apparatus 30. The connection portions 52A, 52B include the communication portions 52C, 52D, respectively, having diameters equal or substantially equal to the inner diameters of the supply pipe 31 and discharge pipe 33. The communication portions 52C, 52D are holes that communicate the sealed space 54 with the outside of the storage container 50.

The cover 53 is disposed at one surface that is a side surface of the body 51. The cover 53 is provided with, for example, a latch mechanism 58. The latch mechanism 58 includes a latch 58A and a cam 58B. The latch 58A has a structure such that an end of the latch 58A on the side opposite to the cam 58B is put in and out by inserting a key (not shown) into an insertion hole 58C provided at the cam 58B and turning the key. This end of the latch 58A is then fitted into a fitting groove 51A provided in the body 51 on the surface facing the latch 58A, such that the cover 53 is fixed to the body 51.

Figure 4:
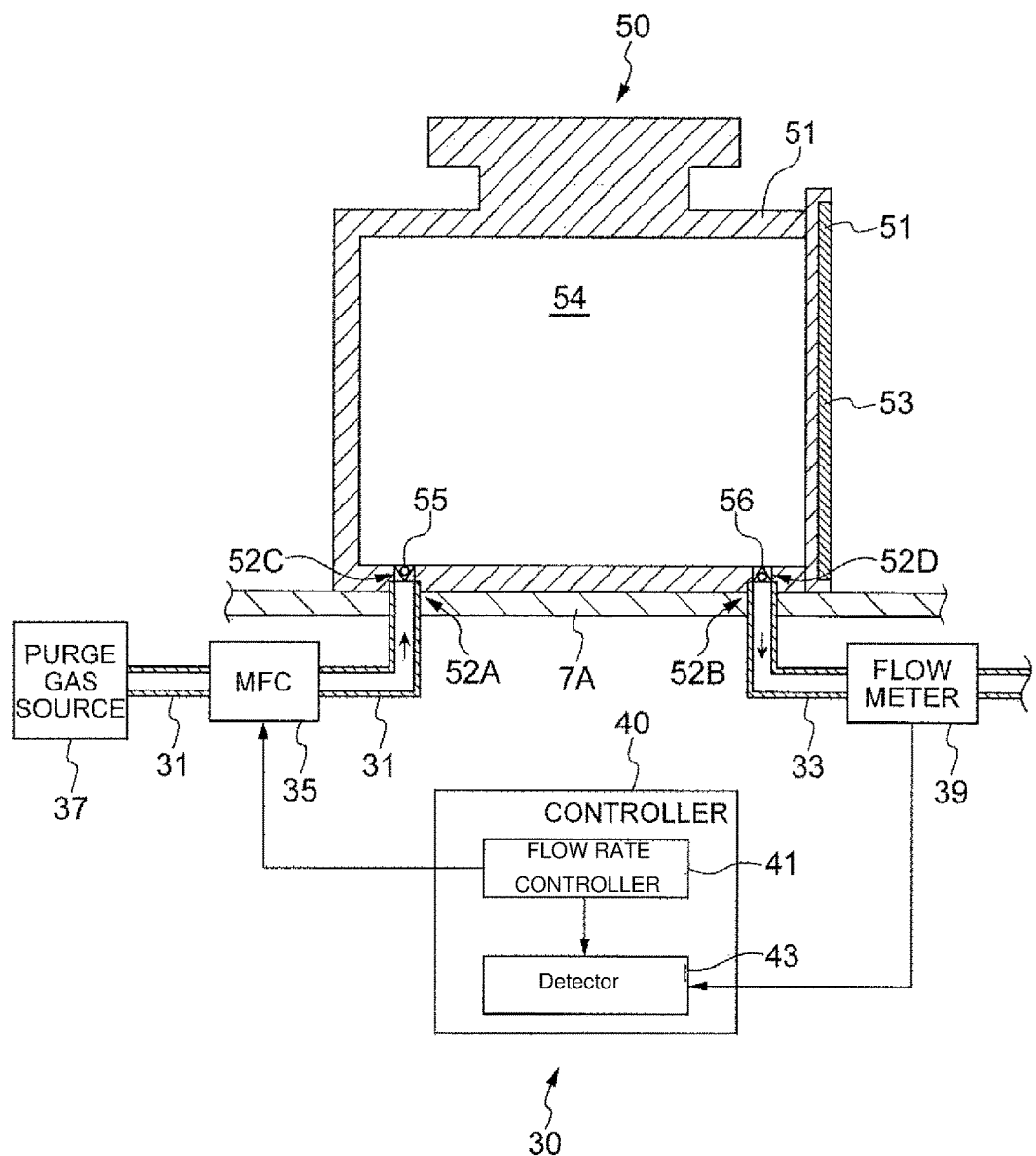
FIG. 4 is a schematic configuration diagram showing a configuration of the purge apparatus in FIG. 1.

The purge apparatus 30 will now be described, which purges the inside of the storage container 50 as described above with a purge gas (for example, nitrogen gas). FIG. 4 is a schematic configuration diagram showing a configuration of the purge apparatus 30. As shown in FIG. 4, the purge apparatus 30 includes a supply pipe 31, a mass flow controller (MFC) 35, a purge gas source 37, a discharge pipe 33, a flowmeter (meter) 39, and a controller 40.

The front end of the supply pipe 31 includes a nozzle that is able to connect to the supply port 55 of the storage container to supply a purge gas to the storage container 50. In the present preferred embodiment, the supply pipe 31 is brought into intimate contact with the connection portion 52A to be connected to the communication portion 52C. The MFC 35 measures the mass flow rate of the purge gas flowing through the supply pipe 31 and performs flow rate control. The purge gas source 37 is a tank that stores a purge gas.

The front end of the discharge pipe 33 includes a nozzle that is able to connect to the discharge port 56 of the storage container 50 to suck the purge gas in the inside 54 of the storage container 50 and discharge the purge gas in the inside 54 of the storage container 50. In the present preferred embodiment, the discharge pipe 33 is brought into intimate contact with the connection portion 52B to be connected to the communication portion 52D. The flowmeter 39 measures the flow rate of the purge gas flowing through the discharge pipe 33.

The controller 40 controls a variety of purging in the purge apparatus 30 and is, for example, an electronic control unit or circuitry including a central processing unit (CPU), a read only memory (ROM), and a random access memory (RAM). As shown in FIG. 4, the controller 40 includes a flow rate controller 41 and a detector 43 configured or programmed to define and function as conceptual units that execute a variety of control processes in the purge apparatus 30. The functions executed by such conceptual units are executed under the control of the CPU or the like.

The flow rate controller 41 switches between a first mode in which purging is carried out by supplying purge gas to the storage container 50 at a first flow rate and a second mode in which purging is carried out by supplying purge gas to the storage container 50 at a second flow rate. Here, the "first flow rate" refers to a flow rate up to a predetermined flow rate, in the storage container 50 in which purge gas leaks from a portion other than the discharge port of the storage container 50 (for example, as shown in FIG. 3A and FIG. 3B, the portion between the body 51 and the cover 53) when the flow rate of the purge gas supplied to the storage container 50 is greater than the predetermined flow rate. The "second flow rate" refers to the flow rate greater than the first flow rate.

The detector 43 determines whether purging is satisfactory, based on the exhaust flow rate measured by the flowmeter 39. Specifically, the detector 43 determines whether purging is satisfactory, based on a supply flow rate Fs by the MFC 35 when controlled with the first flow rate (the first mode) by the flow rate controller 41, and an exhaust flow rate Fe measured by the flowmeter 39 disposed at the discharge pipe 33. For example, when the exhaust flow rate Fe is smaller than the supply flow rate Fs by a predetermined amount or more, it is determined that purging is not being performed satisfactorily.

The detector 43 may determine whether purging is satisfactory, considering the flow rate transfer ratios in the not-shown nozzle that injects purge gas from the front end of the supply pipe 31 to the storage container 50 and the not-shown nozzle that injects purge gas from the storage container 50 to the discharge pipe 33. For example, when the flow rate transfer ratio of the nozzle that injects purge gas to the storage container 50 in the supply pipe 31 is defined as A, and the flow rate transfer ratio of the nozzle that injects purge gas to the discharge pipe 33 in the storage container 50 is defined as B, if the exhaust flow rate Fe is smaller than a value obtained by multiplying the supply flow rate Fs by A and B (Fs×A×B), by a predetermined amount or more, it may be determined that purging is not being performed satisfactorily.

The flow rate transfer ratios A and B can be set as appropriate according to the characteristics of the nozzles. If the nozzles are made of metal, a value of about 0.70 to about 0.95 may be set as the flow rate transfer ratios A and B, for example. If the nozzles are elastic, a value of about 0.90 to about 1.00 may be set as the flow rate transfer ratios A and B, for example.

Figure 5:
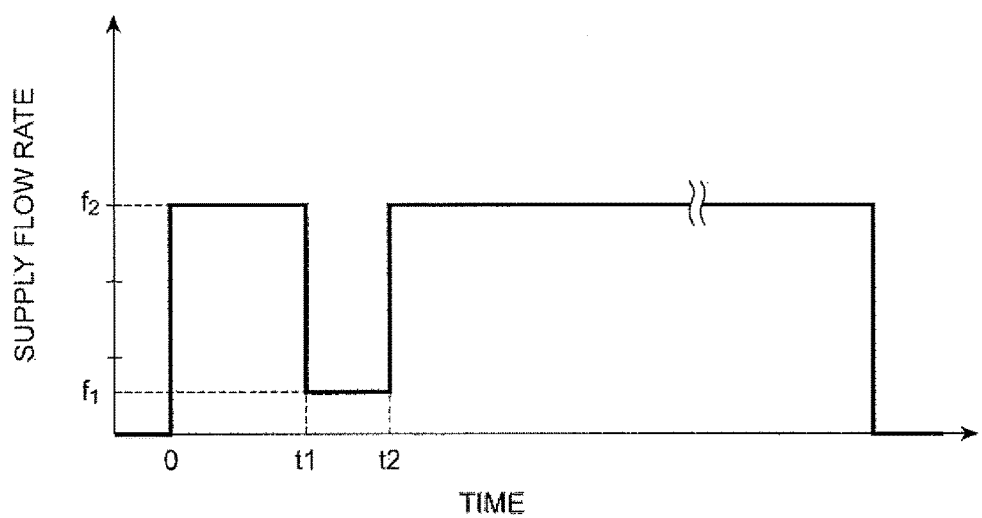
FIG. 5 is a timing chart showing mode switching in a flow rate controller in FIG. 4.

The operation of purging in the purge apparatus 30 will now be described. When placement of the storage container 50 on the purge apparatus 30 is detected (or the user inputs a purging instruction), the flow rate controller 41 starts supply of a purge gas to the storage container 50 (purging). As shown in FIG. 5, the flow rate controller 41 starts a mode of supplying purge gas at a flow rate f2 that is the second flow rate (the second mode) and continues the second mode until time t1.

The flow rate controller 41 thereafter switches to a mode of supplying purge gas at a flow rate f1 that is the first flow rate (the first mode) in order to determine whether the purging is satisfactory, and continues the first mode until time t2. The detector 43 determines whether the purging is satisfactory by the method as illustrated above at this time (the first mode). The flow rate controller 41 thereafter switches again to the mode of supplying purge gas at the flow rate f2 that is the second flow rate (the second mode), and continues the mode for a predetermined time or until the storage container 50 is moved from the storage shelf 7A.

The result of the determination by the detector 43 as to whether the purging is satisfactory may be indicated to the operator, for example, by display appearing on a not-shown display (not shown) of the purge apparatus 30, by producing a warning sound, or by transmitting information of the result to another terminal.

In the purge apparatus 30 described above, the flowmeter 39 that measures the flow rate of the purge gas flowing through the discharge pipe 33 is provided not in the measuring unit placed on the purge apparatus 30 but in the purge apparatus 30. Thus, the exhaust flow rate is able to be measured when purge gas is supplied to the storage container 50 in a state in which the storage container 50 to be purged is actually placed on the purge apparatus 30, and whether purging is satisfactory is able to be determined based on the measured exhaust flow rate. Accordingly, whether satisfactory purging is being performed is able to be determined during a process of actually supplying purge gas to the storage container 50.

Figure 6:
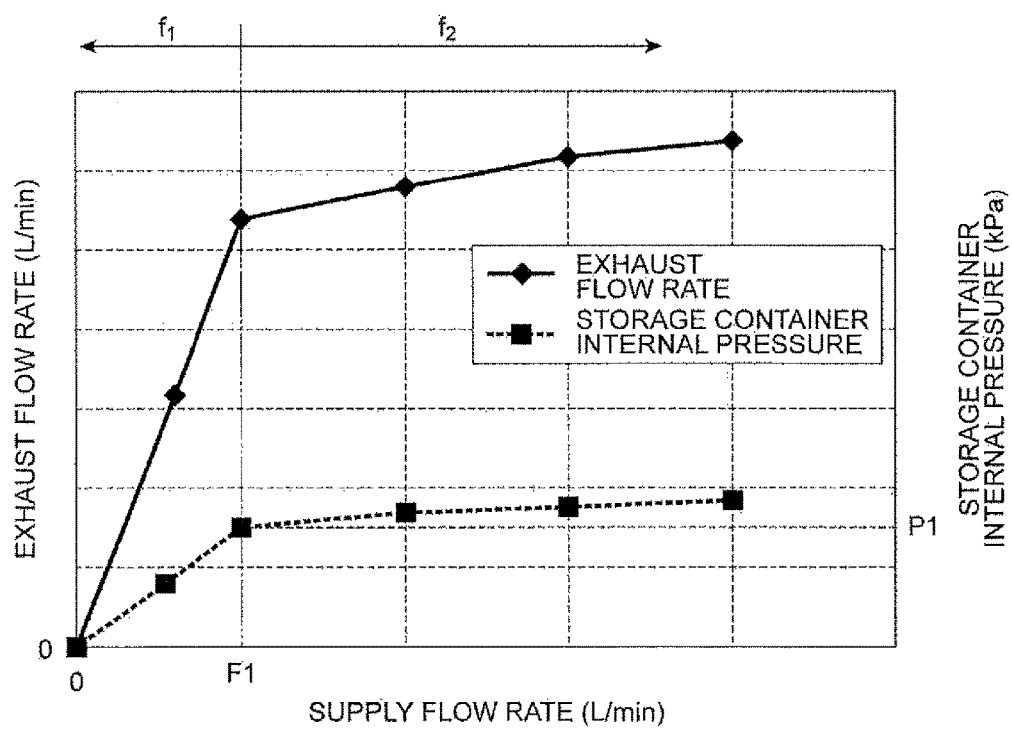
FIG. 6 is a graph showing the relation between a supply flow rate and an exhaust flow rate in a state in which a discharge pipe is connected to a discharge port of the storage container.

The inventors of the subject application have conducted elaborate studies that led to the discovery that the exhaust efficiency is greatly affected by the hermeticity of the storage container 50. That is, as shown in FIG. 6, when the flow rate of purge gas supplied to the storage container 50 is greater than a predetermined flow rate F1 (when the internal pressure of the storage container 50 is greater than a predetermined pressure P1), the purge gas leaks from between the cover 53 and the body 51 of the storage container 50 and the flow rate of exhaust discharged from the discharge pipe 33 tends to be saturated. In other words, it has been discovered that the exhaust flow rate that is proportional or substantially proportional to the supply flow rate is obtained up to the predetermined flow rate F1 (0 to F1) at which purge gas leaks from between the cover 53 and the body 51 of the storage container 50.

The purge apparatus 30 described above is switchable between the first mode in which purging is carried out by supplying purge gas to the storage container 50 at a first flow rate f1 and the second mode in which purging is carried out by supplying purge gas to the storage container 50 at a second flow rate f2, where the first flow rate f1 is a supply flow rate up to a predetermined flow rate F1, in the storage container 50 in which purge gas leaks from between the cover 53 and the body 51 of the storage container 50 when the flow rate of the purge gas supplied to the storage container 50 is greater than the predetermined flow rate F1, as shown in FIG. 6, and the second flow rate f2 is a flow rate greater than the first flow rate. The purge apparatus 30 then measures the exhaust flow rate in the first mode and determines whether purging is satisfactory based on the exhaust flow rate measured in the first mode.

This purge apparatus 30 determines whether purging is satisfactory, based on the supply flow rate that is the first flow rate f1 at which the exhaust flow rate is proportional or substantially proportional to the supply flow rate, and the exhaust flow rate obtained when purging is performed at the first flow rate f1. Thus, whether purging is satisfactory is able to be determined based on the supply flow rate and the exhaust flow rate that are proportional or substantially proportional to each other, thus enabling an accurate determination.

The purge apparatus 30 s described above starts purging in the second mode, thereafter switches to the first mode, measures the exhaust flow rate in the first mode, and determines whether purging is satisfactory, based on the exhaust flow rate measured in the first mode. Thus, purge gas is initially supplied to the storage container 50 at a relatively large flow rate, so that the inside of the storage container 50 is able to be cleaned early. This reduces the possibility that the product is contaminated.

Figure 7A:
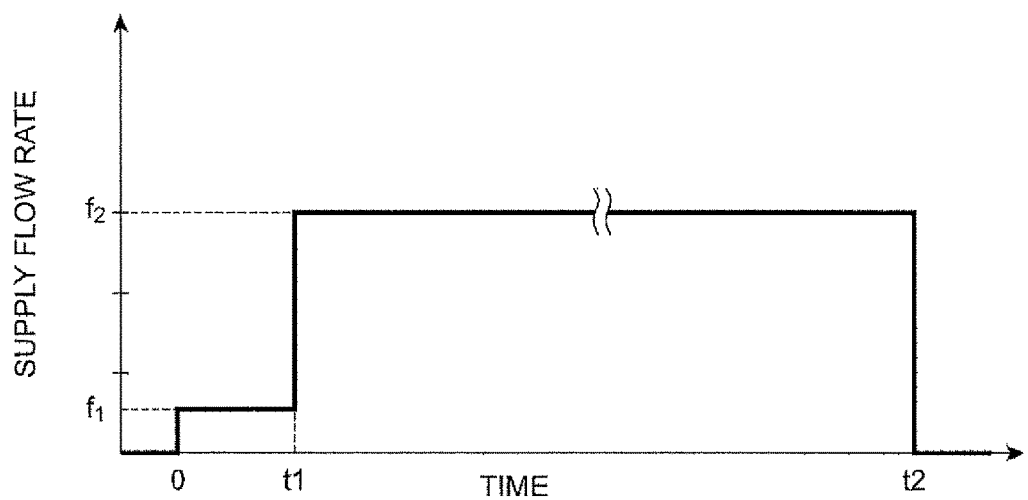
FIG. 7A and FIG. 7B are timing charts showing mode switching in the flow rate controller according to modifications of preferred embodiments of the present invention.
Figure 7B:
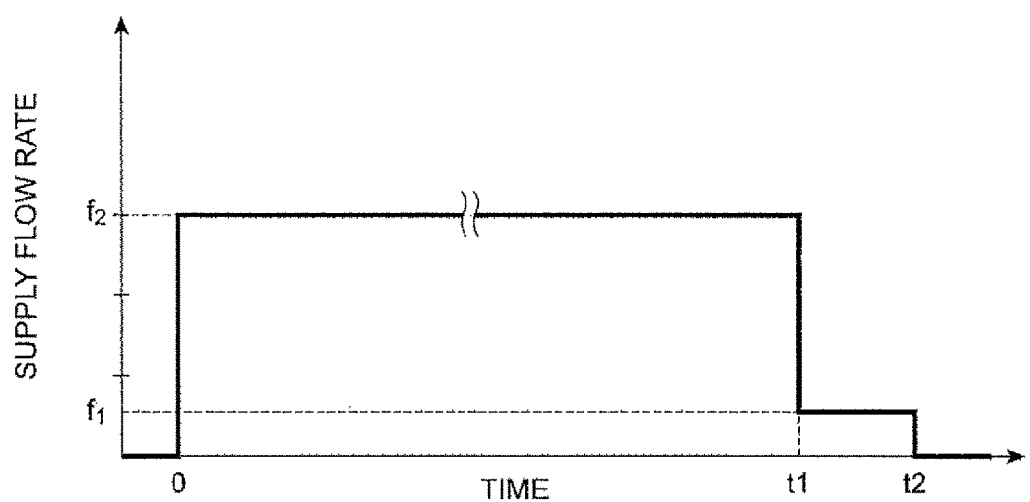

Although preferred embodiments of the present invention have been described above, the present invention is not limited to the foregoing preferred embodiments and various modifications are possible without departing form the scope of the present invention.
First Modification In the purge stocker 1 in the foregoing preferred embodiment, the first mode and the second mode are preferably switched at the timings illustrated in FIG. 5. However, the present invention is not limited to this preferred embodiment. For example, as shown in FIG. 7A, the purge apparatus 30 may start purging in the first mode, determine whether purging is satisfactory based on the exhaust flow rate measured in the first mode, and then switch to the second mode to continue the purging. In this case, whether purging is satisfactory is able to be determined at an early stage in the purging, so that if a problem arises, measures can be taken early.
Second Modification As shown in FIG. 7B, the purge apparatus 30 may start purging in the second mode, switch to the first mode at the last stage in which the purging is terminated, determine whether the purging is satisfactory based on the exhaust flow rate measured in the first mode, and terminate the purging as it is. In this case, purge gas is initially supplied to the storage container 50 at a relatively large flow rate, so that the inside of the storage container 50 is able to be cleaned early. This control is effective when whether purging has been performed satisfactorily is confirmed at any timing.
Other Modifications In the foregoing preferred embodiments, the purge apparatus 30 disposed in the purge stocker 1 has been illustrated. However, the present invention is not limited to these preferred embodiments. The present invention is not limited to a purge apparatus disposed in a space defined by the partition 3 or the like, and the purge apparatus in the foregoing preferred embodiments and modifications is applicable to, for example, a relay point between ceiling vehicles, a delivery point (load port) from a conveyor to a ceiling vehicle, and a ceiling buffer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A purge apparatus for purging with a purge gas an inside of a storage container in which a product is stored, the purge apparatus comprising:
   a discharge pipe that connects to a discharge port of the storage container to discharge the purge gas inside the storage container;
   a flow rate controller that is configured or programmed to switch between a first mode in which the purging is carried out by supplying the purge gas to the storage container at a first flow rate, which is less than or equal to a predetermined flow rate, and a second mode in which the purging is carried out by supplying the purge gas to the storage container at a second flow rate, which is greater than the predetermined flow rate;
   a meter that measures an exhaust flow rate that is a flow rate of the purge gas flowing through the discharge pipe when the purging is carried out; and a detector that determines, while the purging is carried out in the first mode, whether the purging is satisfactory by comparing the exhaust flow rate measured by the meter with a supply flow rate of supplying the purge gas to the storage container, wherein while the purging is carried out in the second mode, the detector does not determine whether the purging is satisfactory and does not compare the exhaust flow rate measured by the meter with the supply flow rate.

2. The purge apparatus according to claim 1, wherein the predetermined flow rate is a flow rate in the storage container in which the purge gas leaks from a portion of the storage container other than the discharge port of the storage container when the flow rate of the purge gas supplied to the storage container is greater than the predetermined flow rate.

3. The purge apparatus according to claim 2, wherein the flow rate controller starts the purging in the second mode, switches to the first mode to perform the purging to determine whether the purging is satisfactory, and performs again the purging in the second mode.

4. The purge apparatus according to claim 1, further comprising:

a supply pipe that connects to a supply port of the storage container to supply the purge gas to the storage container; and a mass flow controller that regulates the supply flow rate of the purge gas flowing through the supply pipe during the purging of the storage container; wherein the detector determines whether the purging is satisfactory by comparing the supply flow rate achieved by the mass flow controller in the first mode with the exhaust flow rate measured in the first mode.

5. The purge apparatus according to claim 4, further comprising an information transmitter that transmits the determination of whether the purging is satisfactory.

6. The purge apparatus according to claim 1, wherein:

when the purging is carried out in the first mode, the purge apparatus provides an output to an operator of the purge apparatus indicating whether the purging is satisfactory or unsatisfactory; and when the purging is carried out in the second mode, the purge apparatus does not provide the output to the operator of the purge apparatus indicating whether the purging is satisfactory or unsatisfactory.

7. The purge apparatus according to claim 1, wherein, when the purging is carried out in the first mode, the detector determines that the purging is satisfactory when the exhaust flow rate measured by the meter is greater than or equal to the supply flow rate by a predetermined amount.

8. A purge method of purging, with a purge gas, an inside of a storage container in which a product is stored, the purge method comprising:

connecting a discharge pipe to a discharge port of the storage container, the discharge pipe being capable of discharging the purge gas inside the storage container;

switching a flow rate controller between a first mode in which the purging is carried out by supplying the purge gas to the storage container at a first flow rate, which is less than or equal to a predetermined flow rate, and a second mode in which the purging is carried out by supplying the purge gas to the storage container at a second flow rate, which is greater than the predetermined flow rate;

measuring, by a meter, an exhaust flow rate that is a flow rate of the purge gas flowing through the discharge pipe when the purging is carried out; and determining, by a detector and while the purging is carried out in the first mode, whether the purging is satisfactory by comparing the exhaust flow rate measured by the meter with a supply flow rate of supplying the purge gas to the storage container, wherein while the purging is carried out in the second mode, the detector does not determine whether the purging is satisfactory and does not compare the exhaust flow rate measured by the meter with the supply flow rate.

9. A purge method according to claim 8, wherein the predetermined flow rate is a flow rate in the storage container in which the purge gas leaks from a portion of the storage container other than the discharge port of the storage container when the flow rate of the purge gas supplied to the storage container is greater than the predetermined flow rate.

10. A purge method according to claim 8, further comprising:

connecting a supply pipe to a supply port of the storage container to supply the purge gas to the storage container; and regulating the supply flow rate of the purge gas flowing through the supply pipe during the purging of the storage container with a mass flow controller; wherein the detector determines whether the purging is satisfactory by comparing the supply flow rate achieved by the mass flow controller in the first mode with the exhaust flow rate measured in the first mode.

11. A purge method according to claim 10, further comprising transmitting the determination of whether the purging is satisfactory by an information transmitter.

12. The purge method according to claim 8, further comprising:

when the purging is carried out in the first mode, providing an output to an operator of the purge apparatus indicating whether the purging is satisfactory or unsatisfactory; and when the purging is carried out in the second mode, not providing the output to the operator of the purge apparatus indicating whether the purging is satisfactory or unsatisfactory.

13. The purge method according to claim 8, wherein, when the purging is carried out in the first mode, the detector determines that the purging is satisfactory when the exhaust flow rate measured by the meter is greater than or equal to the supply flow rate by a predetermined amount.

* * * * *